United States Patent
Wong et al.

(10) Patent No.: US 7,295,074 B2
(45) Date of Patent: Nov. 13, 2007

(54) DOHERTY POWER AMPLIFIER WITH PHASE COMPENSATION

(75) Inventors: Gerald K. Wong, Cupertino, CA (US);
Tushar Ramanlal Shah, Milpitas, CA (US); Korhan Titizer, Saratoga, CA (US)

(73) Assignee: Beceem Communications Inc., Santa Clara, CA (US)

( * ) Notice: Subject to any disclaimer, the term of this patent is extended or adjusted under 35 U.S.C. 154(b) by 88 days.

(21) Appl. No.: 11/097,118

(22) Filed: Mar. 31, 2005

(65) Prior Publication Data
US 2006/0220744 A1 Oct. 5, 2006

(51) Int. Cl.
*H03F 3/68* (2006.01)
(52) U.S. Cl. .................. 330/295; 330/124 R
(58) Field of Classification Search ............ 330/295, 330/124 R
See application file for complete search history.

(56) References Cited

U.S. PATENT DOCUMENTS

| 5,901,346 A * | 5/1999 | Stengel et al. ............ 455/126 |
| 6,356,149 B1 * | 3/2002 | Stengel et al. ............ 330/107 |
| 6,864,742 B2 * | 3/2005 | Kobayashi ............ 330/124 R |
| 7,053,706 B2 * | 5/2006 | Kwon et al. ............ 330/124 R |
| 2005/0017802 A1 * | 1/2005 | Robinson ............ 330/151 |
| 2006/0152279 A1 * | 7/2006 | Kijima ............ 330/124 R |

OTHER PUBLICATIONS

Notification of Transmittal of the International Search Report and the Written Opinion of the International Searching Authority, or the Declaration, Jan. 5, 2007.

* cited by examiner

*Primary Examiner*—Patricia Nguyen

(57) ABSTRACT

A Doherty power amplifier is provided that includes a main amplifier device and an auxiliary amplifier device. The Doherty power amplifier further includes a phase compensation network. The phase compensation network is configured to maintain a substantially constant phase of one of an output signal from the main amplifier device or an output signal from the auxiliary amplifier device across a range of input powers. The Doherty power amplifier further includes an impedance inverter for power combining an output signal of the main amplifier device with an output signal of the auxiliary amplifier device.

20 Claims, 5 Drawing Sheets

DOHERTY POWER AMPLIFIER WITH PHASE COMPENSATION

TECHNICAL FIELD

The present invention relates to electrical circuits.

BACKGROUND

Wireless communication systems often employ power amplifiers. A conventional optimum power amplifier has a low level of DC power consumption and a high level of power added efficiency (i.e. ratio of the difference between the output power and the input power to DC power). In general, a power amplifier operates at maximum power efficiency when the power amplifier transmits peak output power. However, power efficiency worsens as output power decreases.

One type of a power amplifier that addresses the problem of efficiency at lower output powers is a Doherty amplifier. For an overview of the Doherty amplifier, see Doherty, W. H., A New High Efficiency Power Amplifier For Modulated Waves, Proceedings of the Institute of Radio Engineers, Vol. 24, No. 9, pp. 1163-82, September 1936, which is hereby incorporated by reference.

Referring to FIG. 1, a typical Doherty amplifier 100 can include a main amplifier device 102 and an auxiliary amplifier device 104 connected in parallel. An input signal 110 can be split into two signals by an input splitter 112. One of the resulting signals can be coupled to an input of the main amplifier device 102, and another signal can be coupled to an input of the auxiliary amplifier device 104. The output of the main amplifier device 102 can be power combined with the output of the auxiliary amplifier device 104 through a transmission line 106.

The main amplifier device 102 can be configured to be on for the entire range of output powers of the power amplifier. The auxiliary amplifier device 104 can be configured to turn on only when the main amplifier device 102 saturates. The output power at which the auxiliary amplifier device 104 turns on (and the main amplifier device 102 saturates) is referred to as a power transition point $P_T$. The power transition point $P_T$ can be determined by a design parameter γ. The design parameter γ is a ratio of the maximum current through the load 108 to the maximum current delivered by the main amplifier device 102.

The transmission line 106 that operates to combine the output of the main amplifier device 102 with the output of the auxiliary amplifier device 104 can be a quarter-wave impedance inverter. The quarter-wave impedance inverter can add a 90° phase lag to the output (e.g., current) of the main amplifier device 102. The phase of the auxiliary amplifier output current is typically designed to lag the main amplifier current by 90° so that the two currents add in phase when the two currents are combined at the output of the impedance inverter.

Referring to FIG. 2, the phase of the output signal of the main amplifier device 102, as a function of input power, (as shown in plot 202) is typically different from the phase of the output signal of the auxiliary amplifier device 104, as a function of input power (as shown in plot 204). The phase of the output signal of the main amplifier device 102 typically decreases (or lags) by a small amount as the input power increases from very low or no input power to the power transition point $P_T$. As the input power further increases beyond the power transition point $P_T$, where the main amplifier device 102 saturates and the auxiliary amplifier device 104 turns on, the phase of the output signal of the main amplifier device 102 typically starts increasing (or leading).

By contrast, the phase of the output signal of the auxiliary amplifier device 104 typically increases as the input power increases from very low or no input power to the power transition point $P_T$. As the input power further increases beyond the power transition point $P_T$, the phase of the output signal of the auxiliary amplifier device 104 typically starts decreasing.

The output power at which both the main amplifier device 102 and the auxiliary amplifier device 104 saturate is the maximum output power $P_{SAT}$ of a typical Doherty amplifier 100. The maximum output power $P_{SAT}$ of the Doherty amplifier 100 can be optimized if the Doherty amplifier 100 is configured such that the output signal of the main amplifier device 102 is substantially in-phase (i.e., has substantially the same phase) with the output signal of the auxiliary amplifier device 104 at output powers close to the maximum output power $P_{SAT}$. For example, the adjustment in the phases of the output signals of the main amplifier device 102 and the auxiliary amplifier device 104 can be implemented using a fixed phase adjustment network on either the main amplifier device 102 or the auxiliary amplifier device 104.

Nonetheless, as shown in FIG. 2, the output signal of the main amplifier device 102 can still be out of phase with the output signal of the auxiliary amplifier device 104 at output power levels below the maximum output power $P_{SAT}$ and above the power transition point $P_T$. The divergence in the phases of the output signals of the main amplifier device 102 and the auxiliary amplifier device 104 can result in several problems. At output power levels below $P_{SAT}$ and above $P_T$, the currents from the main amplifier device 102 and the auxiliary amplifier device 104 can add out of phase, which can result in low output power and degraded efficiency. Furthermore at output power levels below $P_{SAT}$ and above $P_T$, the phase of the output current (i.e., the phasor sum of the current in the main amplifier device 102 and the current in the auxiliary amplifier device 104) can change significantly with changes in input power, resulting in large AM/PM variations in the Doherty amplifier 100. Large AM/PM variations in the Doherty amplifier 100 can result in increased distortion. Larger AM/PM variations in the Doherty amplifier 100 can also result in a reduced phase margin if the Doherty amplifier 100 is used in a feedback system.

SUMMARY

In general, in one aspect, a Doherty power amplifier is provided that includes a main amplifier device and an auxiliary amplifier device. The Doherty power amplifier further includes a first phase compensation network. The first phase compensation network is configured to maintain a substantially constant phase of one of an output signal from the main amplifier device or an output signal from the auxiliary amplifier device across a range of input powers. The Doherty power amplifier further includes an impedance inverter for power combining an output signal of the main amplifier device with an output signal of the auxiliary amplifier device.

Implementations of the invention can include one or more of the following features. The Doherty power amplifier can include a second phase compensation network. The second phase compensation network is configured to maintain a substantially constant phase of another one of the output signal from the main amplifier device or the output signal from the auxiliary amplifier device across a range of input powers.

The first phase compensation network can be configured to decrease the phase of the input signal to the main amplifier device as a power level of the input signal to the main amplifier device increases. The second phase compensation network can be configured to increase the phase of the input signal to the auxiliary amplifier device as a power level of the input signal to the auxiliary amplifier device increases.

The first phase compensation network can include a series diode. The second phase compensation network can include a shunt diode.

The Doherty power amplifier can further include an input splitter for splitting an input signal to the Doherty power amplifier into the input signal to the main amplifier device and the input signal to the auxiliary amplifier device. At least one of the input signal to the main amplifier device or the input signal to the auxiliary amplifier device can include a single carrier signal that varies in amplitude. At least one of the input signal to the main amplifier device or the input signal to the auxiliary amplifier device can include a multi-carrier signal.

At least one of the main amplifier device or the auxiliary amplifier device can include a field effect transistor. At least one of the main amplifier device or the auxiliary amplifier device can include a bipolar junction transistor.

Implementations of the invention can realize one or more of the following advantages. The phase lead of the output signal of the main amplifier chain and phase lag of the output signal of the auxiliary amplifier chain can be significantly reduced in a Doherty power amplifier. The currents from the main amplifier chain and the auxiliary amplifier chain can be combined more in-phase at all power levels between $P_T$ and $P_{SAT}$. As a result, more output power can be delivered by a Doherty power amplifier. Moreover, the efficiency of a Doherty power amplifier can be improved. Furthermore, the AM/PM variations can be reduced, which can result in better linearity and greater stability.

The details of one or more implementations of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

The divergence in the phases of the output signals of the main amplifier device and the auxiliary amplifier device in a conventional Doherty power amplifier can be reduced using one or more phase compensation networks. The phase compensation network(s) can be included in the main amplifier chain and/or in the auxiliary amplifier chain as will be discussed in detail below. A phase compensation network included in an amplifier chain (e.g., a main amplifier device or auxiliary amplifier device) can be configured to compensate for the lag or the lead of phase of the output signal of the respective device. In particular, a phase compensation network included in an amplifier chain (e.g., a main amplifier chain or auxiliary amplifier chain) can be configured to maintain a substantially constant phase of the output signal of the respective device.

In one implementation, a phase compensation network can be included in the main amplifier chain of a Doherty power amplifier. The phase compensation network included in the main amplifier chain can be configured to compensate for the phase lead of the main amplifier device at output power levels above the power transition point $P_T$ by decreasing the phase of the input signal of the main amplifier device at those power levels. Likewise, a phase compensation network can be included in the auxiliary amplifier chain. The phase compensation network included in the auxiliary amplifier chain can be configured to compensate for the phase lag of the auxiliary amplifier device at output power levels above the power transition point $P_T$ by increasing the phase of the input signal of the auxiliary amplifier device at those power levels. Consequently, the AM/PM variations in the Doherty power amplifier can be reduced, and linearity, efficiency, and stability can be improved.

Figure 1:
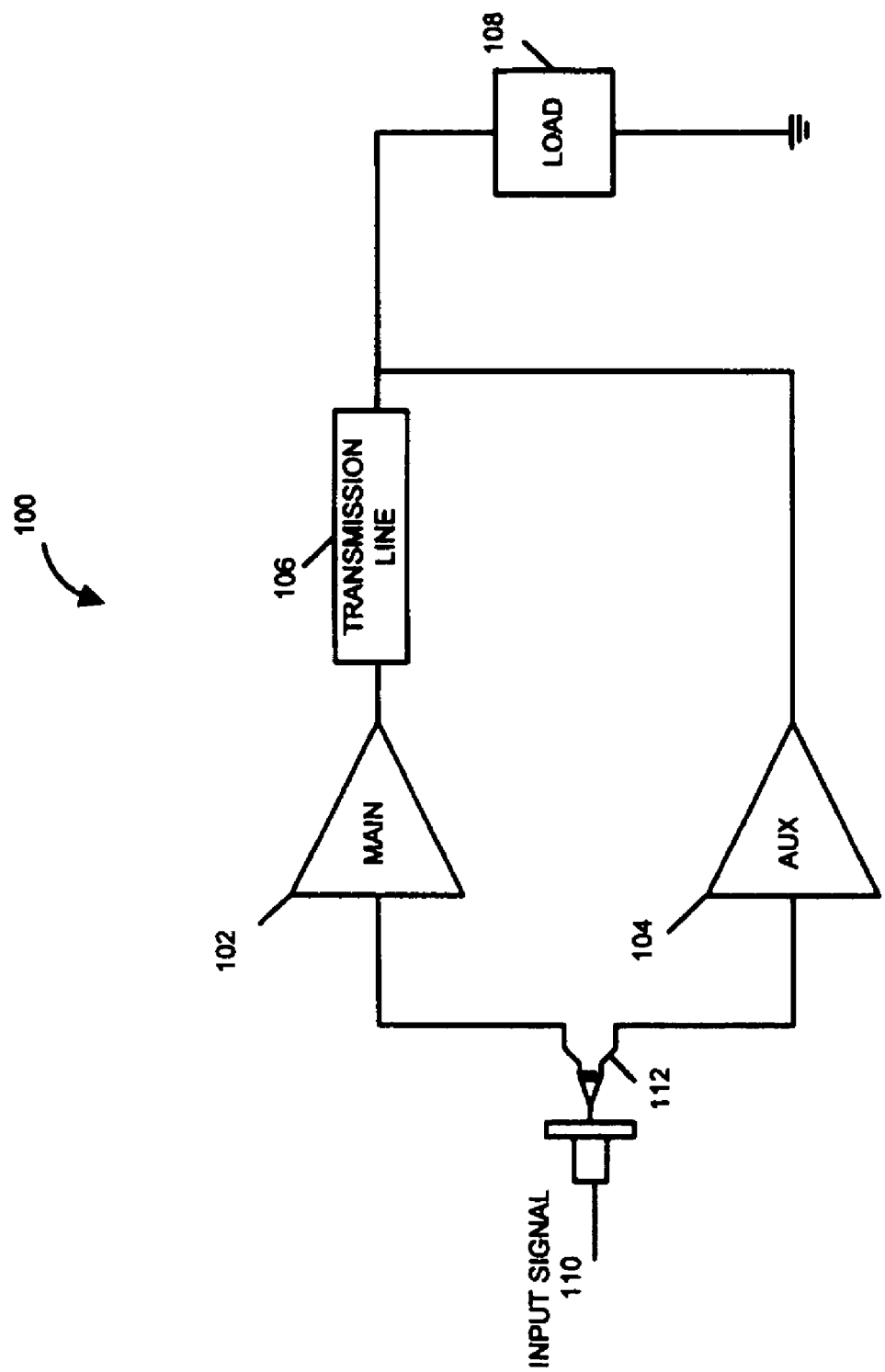
FIG. 1 shows a schematic diagram of a conventional Doherty amplifier.
Figure 2:
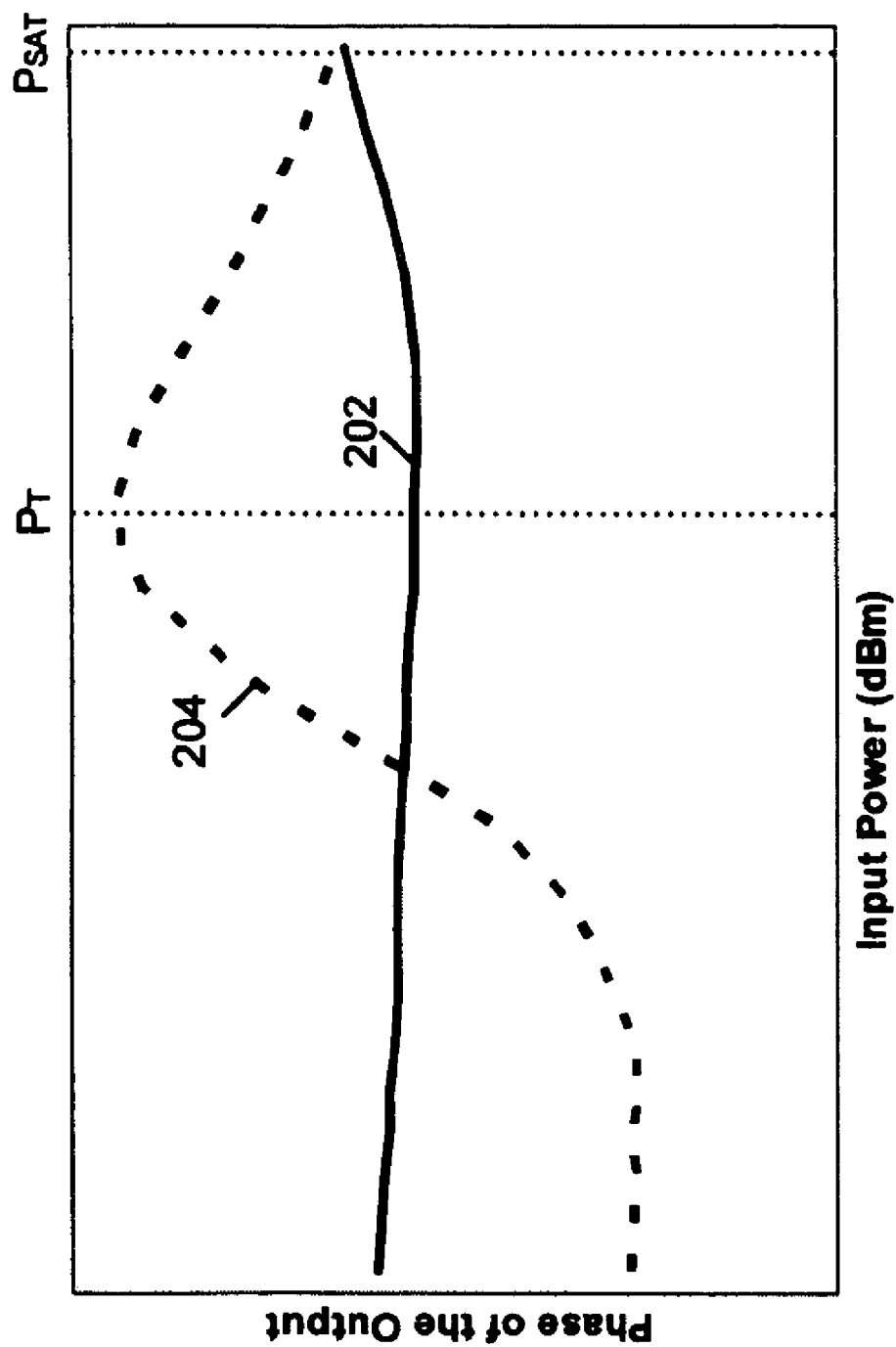
FIG. 2 shows a plot of the phase of the output signals of the main and the auxiliary amplifier devices of a conventional Doherty amplifier.
Figure 3:
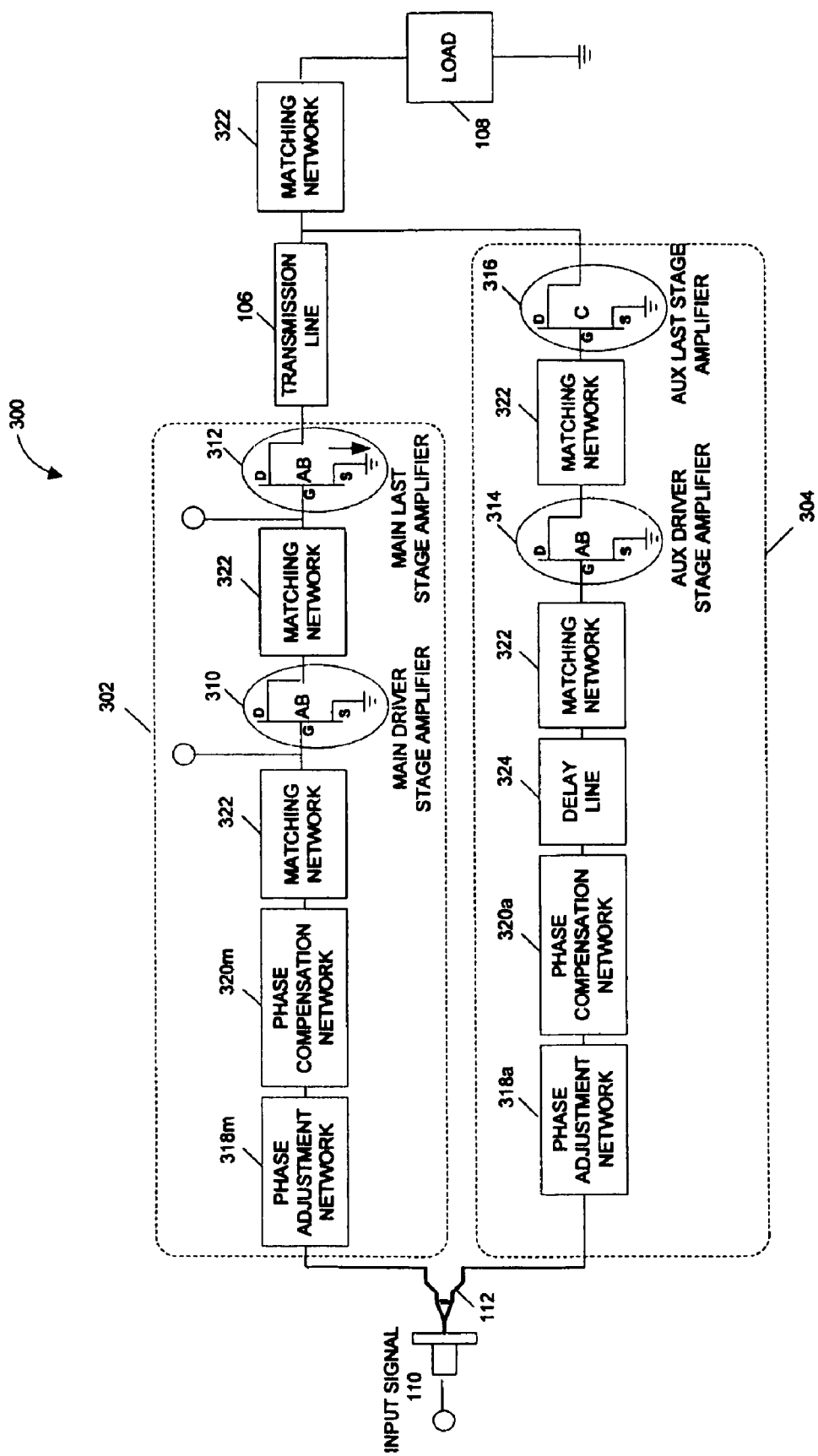
FIG. 3 shows one implementation of a Doherty amplifier that includes phase compensation networks.

Referring to FIG. 3, a power amplifier system 300 in one implementation can include a main amplifier chain 302 and an auxiliary amplifier chain 304 connected in parallel. An input signal 110 can be split into a number of signals (e.g., 2) by an input splitter 112. Power splitting can be implemented in a variety of ways (e.g., using a power splitter, a hybrid coupler, a wire split, and so on). One of the resulting signals can be coupled to an input of the main amplifier chain 302 and another signal can be coupled to an input of the auxiliary amplifier chain 304. The output of the main amplifier chain 302 can be power combined with the output of the auxiliary amplifier chain 304 by a transmission line 106.

The transmission line 106 can be configured such that the output (e.g., current) of the main amplifier chain 302 and the output (e.g., current) of the auxiliary amplifier chain 304 add up in phase. In one implementation, the transmission line 106 that operates to power combine the outputs of the main amplifier chain 302 and the auxiliary amplifier chain 304 can be a quarter-wave impedance inverter. The quarter-wave impedance inverter can add a 90° phase lag to the output (e.g., current) of the main amplifier chain 302.

The main amplifier chain 302 can include a main driver stage amplifier 310 and a main last stage amplifier 312. The auxiliary amplifier chain 304 can include an auxiliary driver stage amplifier 314 and an auxiliary last stage amplifier 316. The main driver stage amplifier 310, the main last stage amplifier 312, the auxiliary driver stage amplifier 314, and the auxiliary last stage amplifier 316 can be implemented in a variety of ways (e.g., using bipolar junction transistors and/or field effect transistors).

The power transition point $P_T$ can be selected by adjusting the size of the auxiliary last stage amplifier 316, the size of the main last stage amplifier 312, the characteristic impedance for transmission line 106, and the bias of the auxiliary stage amplifier 316. In one implementation, the power transition point $P_T$ can be given by 20*log 10(γ) where γ is a ratio of the maximum current through a load 108 to the maximum current delivered by the main amplifier chain 302.

The main driver stage amplifier 310 and the auxiliary driver stage amplifier 314 can be biased class AB. The main last stage amplifier 312 can be biased class AB, and the auxiliary last stage amplifier 316 can be biased class C.

The main amplifier chain 302 can include a main fixed phase adjustment network 318m for adjusting a phase of the input current of the main amplifier device 302. Likewise, the auxiliary amplifier chain 304 can include an auxiliary fixed phase adjustment network 318a for adjusting a phase of the input current of the auxiliary amplifier device 304. In one implementation, a fixed phase adjustment network is required only in one of the two amplifier chains (i.e., main amplifier chain 302 and auxiliary amplifier chain 304).

The power amplifier system 300 can include a number of matching networks 322. A matching network 322 can perform impedance matching between inputs and outputs of various circuit elements in the power amplifier system 300.

The auxiliary amplifier chain 304 can include an input 50Ω quarter-wave delay line 324. The input 50Ω quarter-wave delay line 324 and the quarter-wave impedance inverter 106 can ensure that the output currents from the main amplifier device 302 and the auxiliary amplifier device 304 add up in phase. In one implementation, a lumped element phase shift network can be used instead of the input 50Ω quarter-wave delay line 324. Also, the length of the delay line 324 can be optimized to a value other than a quarter of a wavelength.

Impedance inverters 106, matching networks 322, and phase adjustment networks 318m, 318a can be implemented using capacitors, transmission lines, and inductor based T or PI networks. In one implementation, the phase adjustment network 318a included in the auxiliary amplifier chain 304 can include the delay of transmission line 324.

The main amplifier chain 302 can include a main phase compensation network 320m. The main phase compensation network 320m can compensate for changes in the phase of the output (e.g., current) of the main amplifier chain 302 as a result of the change in the power level of the input signal to the main amplifier chain 302. Likewise, the auxiliary amplifier chain 304 can include an auxiliary phase compensation network 320a. The auxiliary phase compensation network 320a can compensate for changes in the phase of the output (e.g., current) of the auxiliary amplifier chain 304 as a result of the change in the power level of the input signal to the auxiliary amplifier chain 304.

Figure 4A:
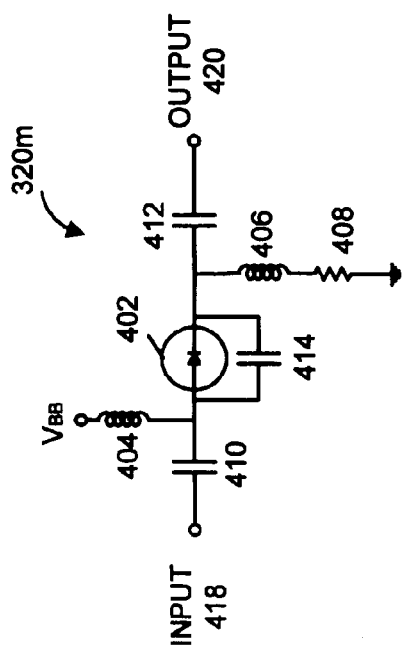
FIG. 4A shows one implementation of a phase compensation network.

Referring to FIG. 4A, a main phase compensation network 320m can include a series diode 402. The series diode 402 can be connected in parallel with a bypass capacitor 414. The bypass capacitor 414 can improve the input/output return loss and decrease the insertion loss of the main phase compensation network 320m. A bias voltage $V_{BB}$ can be supplied to the anode of the series diode 402 through a choking inductor 404. The cathode of the series diode 402 can be connected to ground through another choking inductor 406, which can be tied to ground either directly or through a slope-adjusting resistor 408. An input signal 418 to the main phase compensation network 320m can be coupled to the anode of the series diode 402 through an input DC blocking capacitor 410. Likewise, the cathode of the series diode 402 can be connected to an output DC blocking capacitor 412 to produce the output 420 of to the main phase compensation network 320m.

Figure 4B:
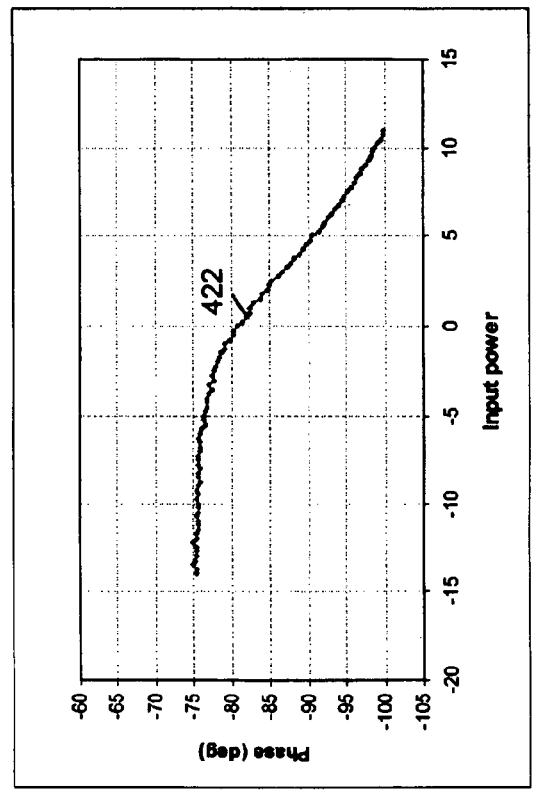
FIG. 4B shows the phase of the phase compensation network in FIG. 4A.

As the power level of the input signal 418 to the main phase compensation network 320m increases, the fraction of the input signal for which the series diode 402 is forward biased can increase. As a result, the equivalent dynamic series resistance of the series diode 402 can decrease. As the equivalent dynamic series resistance of the series diode 402 decreases, the phase of the output signal of the main phase compensation network 320m can decrease as well. Consequently, referring to FIG. 4B, as the power level of the input signal 418 to the main phase compensation network 320m increases, the phase of the output signal 420 of the main phase compensation network 320m can decrease (as shown in plot 422).

Figure 5A:
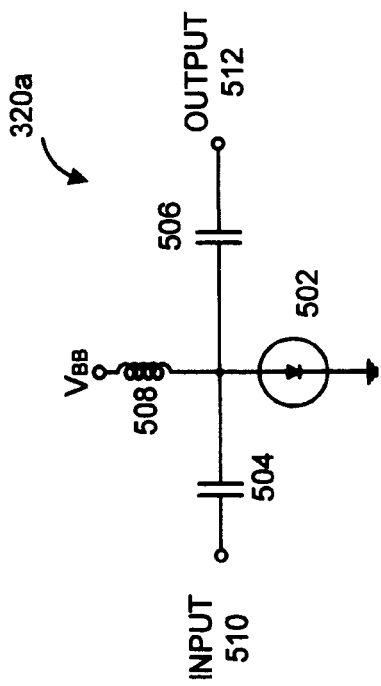
FIG. 5A shows another implementation of a phase compensation network.

Referring to FIG. 5A, an auxiliary phase compensation network 320a can include a shunt diode 502. A bias voltage $V_{BB}$ can be supplied to the anode of the shunt diode 502 through a choking inductor 508. The choking inductor 508 can control the initial impedance of the compensation network 320A. The cathode of the shunt diode 502 can be tied directly to ground. An input signal 510 to the auxiliary phase compensation network 320a can be coupled to the anode of the shunt diode 502 through an input DC blocking capacitor 504. Likewise, the anode of the shunt diode 402 can be connected to an output DC blocking capacitor 506 to produce the output 512 of to the auxiliary phase compensation network 320a.

Figure 5B:
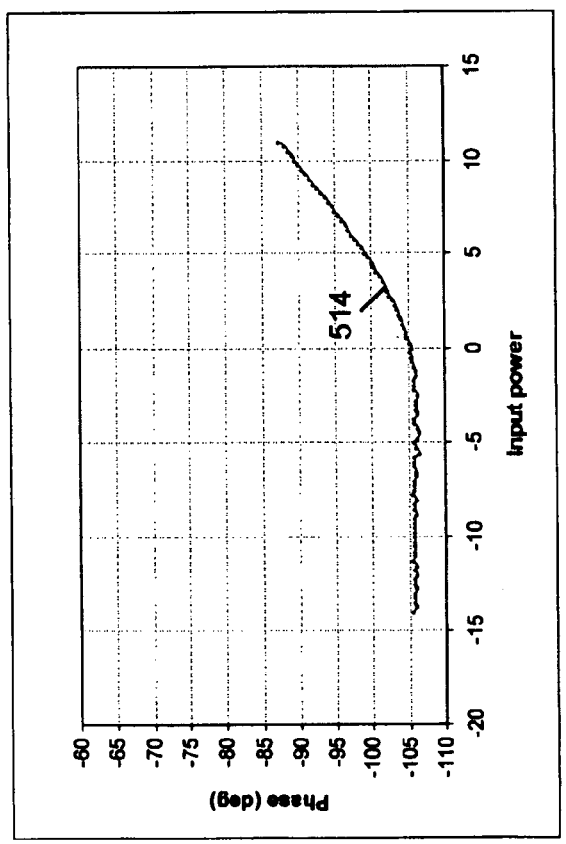
FIG. 5B shows the phase of the phase compensation network in FIG. 5A.

As the power level of the input signal 510 to the auxiliary phase compensation network 320a increases, the positive voltage drop across the shunt diode 502 (i.e. the forward voltage drop $V_f$ across the shunt diode 502) and the negative voltage drop across the shunt diode 502 can also increase. The shunt diode 502 can be configured such that the forward voltage drop $V_f$ across the shunt diode 502 is limited. For example, a schottky diode can be configured to have a limited forward voltage drop $V_f$ of approximately 0.3 volts. Limiting the forward voltage drop $V_f$ across the shunt diode 502 can limit the maximum capacitance of the shunt diode 502 that is due to the forward voltage drop $V_f$. However, as the power level of the input signal 510 to the auxiliary phase compensation network 320a increases, the depletion capacitance of the shunt diode 502 due to the reverse (negative) voltage drop across the shunt diode 502 can decrease. As a result, as the power level of the input signal 510 to the auxiliary phase compensation network 320a increases, the average capacitance of the shunt diode 502 can decrease. As the average capacitance of the shunt diode 502 decreases, the phase of the auxiliary phase compensation network 320a can increase. Consequently, referring to FIG. 5B, as the power level of the input signal 510 to the auxiliary phase compensation network 320a increases, the phase of the output signal 512 of the auxiliary phase compensation network 320a can increase (as shown in plot 514).

A number of embodiments of the invention have been described. Nevertheless, it will be understood that various modifications may be made without departing from the spirit and scope of the invention. For example, in the implementation described in reference to FIG. 3, the main amplifier chain 302 includes a main phase compensation network 320m, and the auxiliary amplifier chain 304 includes an auxiliary phase compensation network 320a. In an alternative implementation, a single phase compensation network (e.g., a main phase compensation network 320m or an auxiliary phase compensation network 320a) can be used.

Moreover, in the implementation described in reference to FIG. 3, an input signal 110 to the power amplifier system 300 is split into a number of signals by a splitter 112. One of the resulting signals is coupled to the input of the main amplifier chain 302 and another signal is coupled to the input of the auxiliary amplifier chain 304. In an alternative implementation, however, the input signal can include a number of signals. One of the input signals can be coupled directly to the main amplifier chain 302 and another input signal can be coupled directly to the input of the auxiliary amplifier chain 304. The phase of the input signal to the main amplifier chain 302 can be controlled such that the phase of the output of the main amplifier chain 302 remains substantially constant across a range of input powers. Likewise, the phase of the input signal to the auxiliary amplifier chain 304 can be controlled such that the phase of the output of the auxiliary amplifier chain 304 remains substantially constant across a range of input powers.

Furthermore, a power amplifier system 300 can include more than two stages. In one implementation, a multistage power amplifier system can include one main amplifier device and multiple auxiliary amplifier devices. The main amplifier chain and the multiple auxiliary amplifier chains (regardless of the number of auxiliary amplifier devices in the power amplifier system) can have a phase compensation network for each chain to improve efficiency, reduce AM-PM variations, improve linearity and improve stability.

The input signal 110 to a power amplifier system can be a single carrier signal or a multi-carrier signal. A single carrier signal is a continuous signal of a single frequency called the carrier, which is modulated by a second data-carrying signal. Common kinds of modulation used for the data-carrying signal are amplitude modulation (AM), frequency modulation (FM), phase modulation (PSK—Phase Shift Keying) and amplitude/phase modulation (QAM—Quadrature Amplitude Modulation). For a multi-carrier signal, the data to be transmitted can be split into several components, and each of these data components can modulate a data carrying signal. The data carrying signal can in turn modulate separate carrier signals. This can also be achieved in digital signal processing by using the FFT/IFFT operation. Individual carriers have narrow bandwidths, but the composite signal can have broad bandwidth depending on the number of carriers supported.

Accordingly, other embodiments are within the scope of the following claims.

What is claimed is:

1. A Doherty power amplifier comprising:
   a main amplifier device;
   an auxiliary amplifier device;
   a first phase compensation network configured to adjust a phase of one of the main amplifier device or the auxiliary amplifier device to achieve a phase profile similar to a phase of the other one of the main amplifier device or the auxiliary amplifier device across a range of input powers, wherein the first compensation network includes a first non-linear circuit, and the second compensation network includes a second non-linear circuit; and
   an impedance inverter for power combining an output signal of the main amplifier device with an output signal of the auxiliary amplifier device.

2. The Doherty power amplifier of claim 1, wherein the first phase compensation network is configured to decrease a phase of an input signal to the main amplifier device as a power level of the input signal to the main amplifier device increases.

3. The Doherty power amplifier of claim 2, wherein the first phase compensation network includes a series diode.

4. The Doherty power amplifier of claim 1, further comprising:
   a second phase compensation network configured to adjust the phase of an other one of the main amplifier device or the auxiliary amplifier device to achieve a phase profile similar to the phase of one of the main amplifier device or the auxiliary device across the range of input powers.

5. The Doherty power amplifier of claim 4, wherein the second phase compensation network is configured to increase a phase of an input signal to the auxiliary amplifier device as a power level of the input signal to the auxiliary amplifier device increases.

6. The Doherty power amplifier of claim 5, wherein the second phase compensation network includes a shunt diode.

7. The Doherty power amplifier of claim 1, further comprising an input splitter for splitting an input signal to the Doherty power amplifier into an input signal to the main amplifier device and an input signal to the auxiliary amplifier device.

8. The Doherty power amplifier of claim 1, wherein at least one of an input signal to the main amplifier device or an input signal to the auxiliary amplifier device comprises a single carrier signal that varies in amplitude.

9. The Doherty power amplifier of claim 1, wherein at least one of an input signal to the main amplifier device or an input signal to the auxiliary amplifier device comprises a multi-carrier signal.

10. The Doherty power amplifier of claim 1, wherein at least one of the main amplifier device or the auxiliary amplifier device includes a field effect transistor.

11. The Doherty power amplifier of claim 1, wherein at least one of the main amplifier device or the auxiliary amplifier device includes a bipolar junction transistor.

12. The Doherty power amplifier of claim 1, wherein the first non-linear circuit includes one of a series or shunt diode, and the second non-linear circuit includes one of a series or shunt diode.

13. A Doherty power amplifier comprising:
   an input splitter for splitting an input signal into a first input signal and a second input signal;
   a main amplifier device having a first phase compensation network, the first phase compensation network including a series diode configured to receive the first input signal and compensate for changes in a phase of the first input signal to produce a first output signal;
   an auxiliary amplifier device having a second phase compensation network, the second phase compensation network including a shunt diode configured to receive the second input signal and compensate for changes in a phase of the second input signal to produce a second output signal; and
   an impedance inverter for power combining the first output signal with the second output signal.

14. The Doherty power amplifier of claim 13, wherein the first phase compensation network and the second phase compensation network are configured to adjust phases of one of the main amplifier device or the auxiliary amplifier device to achieve a similar phase profile across a range of input powers.

15. The Doherty power amplifier of claim 13, wherein the input splitter is operable to split an input signal to the Doherty power amplifier into an input signal to the main amplifier device and an input signal to the auxiliary amplifier device.

16. The Doherty power amplifier of claim 13, wherein at least one of an input signal to the main amplifier device or an input signal to the auxiliary amplifier device comprises a single carrier signal that varies in amplitude.

17. The Doherty power amplifier of claim 16, wherein at least one of an input signal to the main amplifier device or an input signal to the auxiliary amplifier device comprises a multi-carrier signal.

18. The Doherty power amplifier of claim 13, wherein at least one of the main amplifier device or the auxiliary amplifier device includes a field effect transistor.

19. The Doherty power amplifier of claim 13, wherein at least one of the main amplifier device or the auxiliary amplifier device includes a bipolar junction transistor.

20. A Doherty power amplifier comprising:
a main amplifier device;
an auxiliary amplifier device;
a first phase compensation network configured to adjust a phase of one of the main amplifier device or the auxiliary amplifier device to achieve a phase profile similar to a phase of the other one of the main amplifier device or the auxiliary amplifier device across a range of input powers, wherein the first phase compensation network is configured to decrease a phase of an input signal to the main amplifier device as a power level of the input signal to the main amplifier device increases; and
an impedance inverter for power combining an output signal of the main amplifier device with an output signal of the auxiliary amplifier device.

* * * * *